United States Patent
Yin et al.

[11] Patent Number: 6,057,699
[45] Date of Patent: May 2, 2000

[54] BUILT-IN FREQUENCY TEST CIRCUIT FOR TESTING THE FREQUENCY OF THE OUTPUT OF A FREQUENCY GENERATING CIRCUIT

[75] Inventors: Rong Yin, Coppell; Mehdi Zamanian, Carrollton, both of Tex.

[73] Assignee: STMicroelectronics, Inc., Carrollton, Tex.

[21] Appl. No.: 08/988,977

[22] Filed: Dec. 11, 1997

[51] Int. Cl.⁷ .................................................. G01R 31/26
[52] U.S. Cl. ........................................... 324/765; 324/763
[58] Field of Search ............................... 324/158.1, 763, 324/765, 76.39, 76.41, 76.46; 368/118; 340/658

[56] References Cited

U.S. PATENT DOCUMENTS

| | | | |
|---|---|---|---|
| 4,947,382 | 8/1990 | Lesea | 368/118 |
| 5,099,196 | 3/1992 | Longwell et al. | 324/537 |
| 5,266,890 | 11/1993 | Kumbasar et al. | 324/158.1 |
| 5,796,993 | 8/1998 | Maguire | 395/555 |

*Primary Examiner*—Diep N. Do
*Assistant Examiner*—Russell M. Kobert
*Attorney, Agent, or Firm*—Stephen Bongini; Theodore E. Galanthay; Lisa K. Jorgenson

[57] ABSTRACT

A frequency test circuit (200) includes a built-in self test (BIST) circuit (212) which provides for testing of a frequency generating circuit such as an oscillator circuit (100). The test circuit (200) includes circuit stages (202–208) which help produce a reference signal (210) which has substantially the same frequency as that produced by the oscillator circuit (100) when it is operational. Since the low current oscillator circuit (100) can fail at any one of the divider or level shifting stages (106–112), the test circuit (200) can determine if the reference signal and the output signal of the oscillator have substantially the same frequency and produce a test condition signal indicative of either a pass or failed test at test port (214).

20 Claims, 7 Drawing Sheets

BUILT-IN FREQUENCY TEST CIRCUIT FOR TESTING THE FREQUENCY OF THE OUTPUT OF A FREQUENCY GENERATING CIRCUIT

FIELD OF THE INVENTION

This invention relates in general to the field of electronics and more particularly to a circuit for providing built-in frequency testing of a frequency generating circuit.

BACKGROUND OF THE INVENTION

Electronic circuits such as low current crystal oscillators which produce an output frequency signal are used in numerous types of electronic devices. The output signal produced by an oscillator circuit can be used for example as a reference clock signal in an integrated circuit (IC) or other type of electronic circuitry. During the manufacture of an IC or other device incorporating such an oscillator circuit, it is beneficial to test the oscillator circuit to determine if the circuit is operational and producing the required output frequency signal. In some applications (e.g., time keeping circuits, etc.), it may be beneficial to monitor the performance of the frequency generating circuit (e.g., oscillator circuit) on a periodic basis in order to guarantee that the frequency has not changed. This periodic testing is highly beneficial in multi-stage frequency generating circuits in which anyone of the multiple stages can go bad. Such testing helps guarantee that the oscillator circuit is functioning properly.

Prior art approaches for testing such frequency generating circuits although helpful have either required too long to perform or have been limited by the working temperature range requirements of the IC or circuitry under test. Therefore, a need exists for a method and apparatus which can provide a frequency test which can overcome the above mentioned problems.

SUMMARY OF THE INVENTION

Briefly, in accordance with one embodiment of the invention, a built-in frequency test circuit includes a reference signal circuit which produces a reference signal having substantially the same frequency as the output frequency signal generated by a frequency generating circuit when it is operational. The test circuit further includes a comparison circuit for comparing the frequency of the output frequency signal generated by the frequency generating circuit and the frequency of the reference signal. The test circuit provides a test condition signal which indicates the operational condition of the frequency generating circuit.

In a second embodiment of the invention, the built-in frequency test circuit can be selectively placed between a test mode in which the test circuit is operational and a non-test mode in which the test circuit is not operational. In a further embodiment, the built-in test circuit is located within an IC.

DETAILED DESCRIPTION OF THE INVENTION

Figure 1:
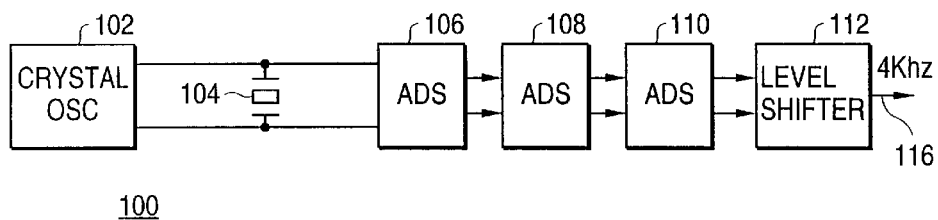
FIG. 1 illustrates a crystal oscillator circuit in accordance with the invention.

Referring now to the drawings and in particular to FIG. 1, there is shown a frequency generating circuit such as a low current crystal oscillator 100. Crystal oscillator 100 is one example of a frequency generating circuit which can be tested using the present invention. The present invention can be used to test any circuit which generates a signal having a frequency.

Crystal oscillator 100 includes a crystal oscillator circuit 102 and crystal 104 which produce a 32 kilohertz (Khz) sinewave signal. Coupled to the oscillator circuit 102 are three analog divider stages (ADS) 106–110. Each of the ADS stages 106–110 provides a frequency divide-by-two stage which is sensitive to low current operation. The first ADS stage 106 receives the 32 Khz signal from the oscillator and divides it down to 16 Khz. The second ADS 108 divides the 16 Khz signal down to 8 Khz and the third and final ADS stage 110 divides the signal down further to 4 Khz. Coupled to the third ADS 110 is a level shifter 112 which provides a one line 4 Khz output signal 116. If the current in the crystal oscillator 100 reaches a minimum or low condition, the first stage to fail in the oscillator circuit 100 will be one of the ADS stages 106–110. If one of the ADS stages fails due to a low current condition or for some other reason, the output signal 116 will change frequency or cease to be generated. The output signal 116 is coupled to a built-in test circuit 200 for use in testing the signal when the test circuit 200 is operational, and to the other circuitry (not shown) for which the oscillator 100 is providing the frequency signal.

Figure 2:
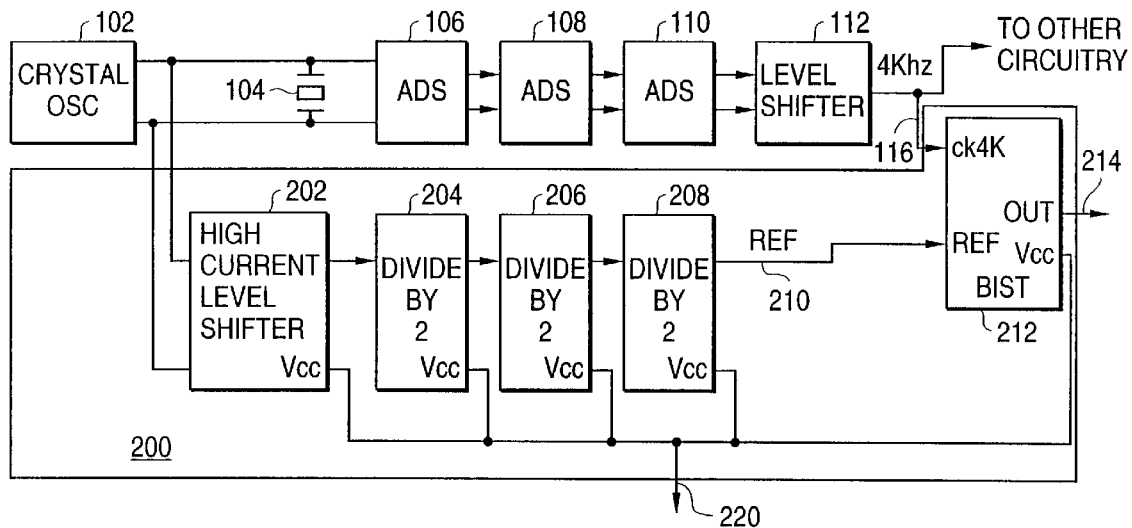
FIG. 2 shows the crystal oscillator circuit of FIG. 1 with the built-in frequency test circuitry in accordance with the preferred embodiment of the invention.

The built-in frequency test circuit 200 in accordance with the preferred embodiment of the present invention is shown in FIG. 2. Coupled to the previously discussed oscillator circuit 100 is a high current level shifter 202 and three divide-by-two frequency dividers 204–208. Components 202–208 comprise a reference signal circuit which produces a frequency signal having substantially the same frequency as that produced by the frequency generating circuit 100 that is to be tested when it is operational.

During normal operation, the level shifter 202 and the three frequency dividers 204–208 are preferably not turned on and are therefore not operational. Only when the oscillator circuit 100 is to be tested, placed in the test mode, will stages 202–208 be activated. The activation of these stages can be controlled in a number of ways. In the case in which the test circuitry 200 is located within an IC, the activation of stages 202–208 can be accomplished by electrically connecting the supply voltage line to these stages to an external test pin 220 located on the IC as shown in FIG. 2 (this assumes all of the stages are grounded). In this particular case, when a particular voltage level is applied to the IC's test pin 220, the built-in test circuitry 202–208 and 212 becomes operational and is placed in the test mode.

In another design, the test circuitry can be placed in the test mode by placing a ground potential on the test pin, this would of course require that supply voltage would already be applied to the test circuitry 202–208 and 212. In still other designs which require the periodic testing of the frequency generating circuit 100 over time, a controller (not shown) such as a microprocessor or other hardware circuitry which can control the operation of these test stages can be designed. The controller can periodically energize stages 202–208 and 212 in order to conduct a frequency test on circuit 100.

The high current level shifter 202 takes the low current signal provided by the oscillator 102 and provides a higher current 32 Khz signal as an input to the first frequency divider 204. Each of the frequency dividers 204–208 divide the frequency by two. The third frequency divider stage 208 provides a 4 Khz reference signal 210, denoted as "ref". Both the 4 Khz signal 116 provided by the oscillator circuit and the 4 Khz "ref" signal 210 are provided as input signals to circuit 212. In this embodiment the frequency test circuit 200 and the oscillator 100 have the same number of stages. By keeping the number of stages the same, it reduces the synchronization problems between signal 116 and the "ref" signal 210.

Figure 9:
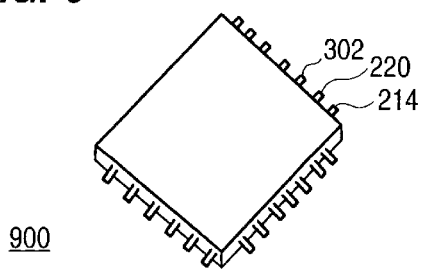
FIG. 9 shows an integrated circuit in accordance with one embodiment of the invention.

Circuit 212, denoted as BIST for built-in-self-test circuit, takes both input signals 116 and 210 and provides a test condition output signal at test output port 214. The test condition output signal found on output 214 provides an indication of whether or not the oscillator circuit 100 is operational and providing the correct output frequency. If for example, circuitry 200 were found inside an IC, the output port 214 could be an external test output pin located on the IC so that the result of the test could be monitored by external test equipment. This particular example is illustrated in FIG. 9, where an IC 900 includes a test pin 220 used to enable the frequency test circuit 200 and a test output port 214 which provides the test result signal. A reset pin 302 discussed further below, allows for the resetting of the frequency test circuit 200.

Figure 3:
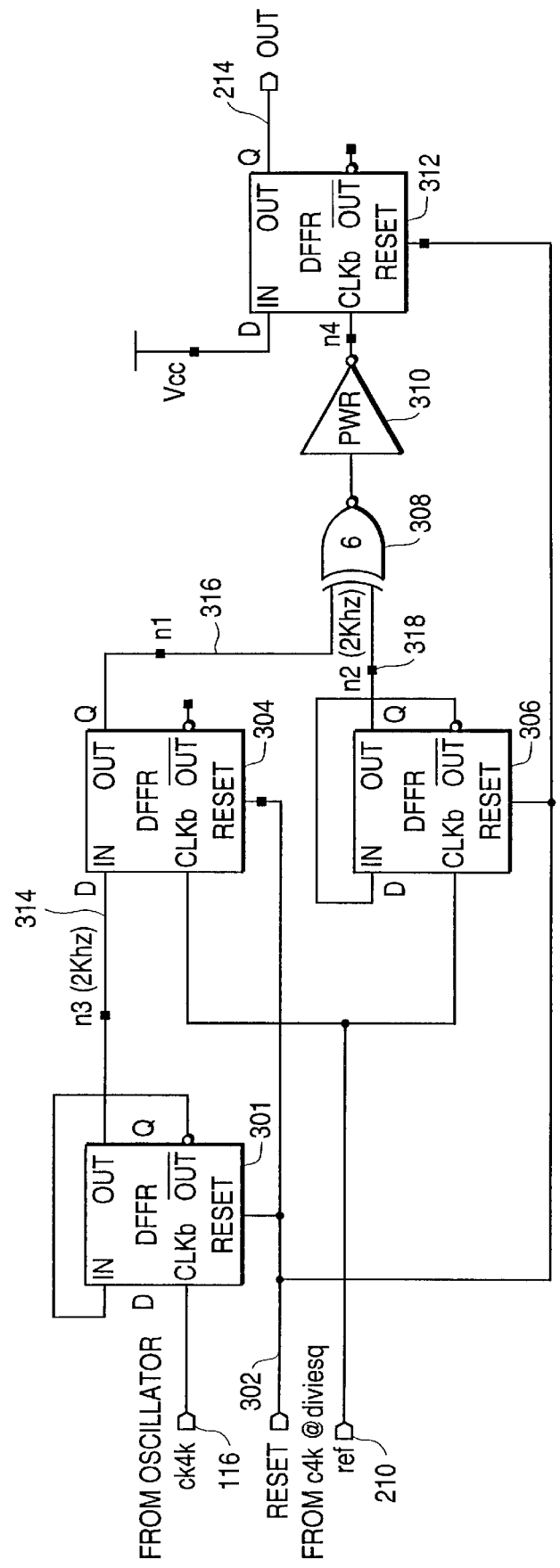
FIG. 3 shows an electrical schematic of the built-in self test (BIST) block shown in FIG. 2.
Figure 4:
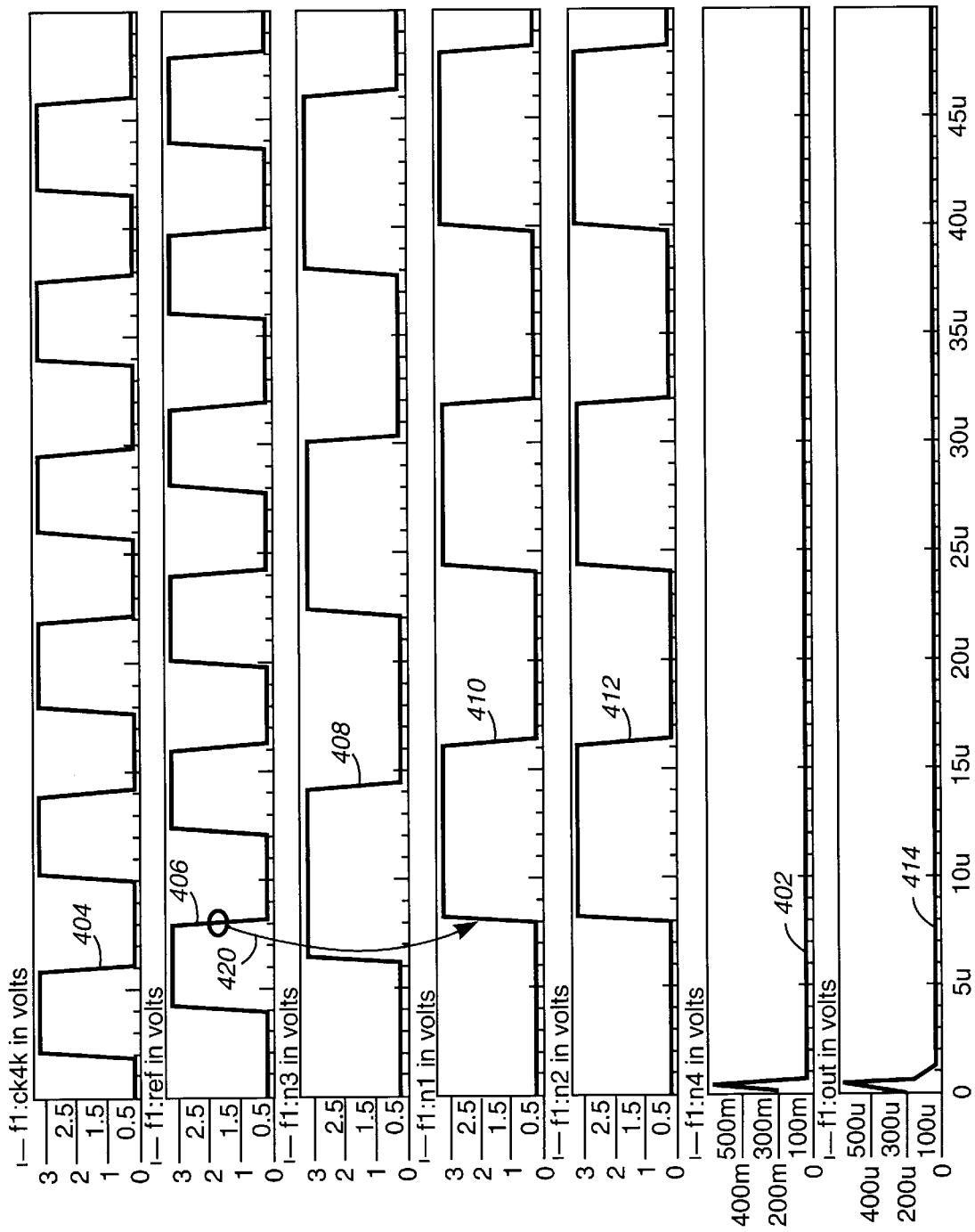
FIG. 4 illustrates a waveform chart showing the input, output and node signals found in the test circuit shown in FIG. 2 for one particular set of signal conditions in accordance with the invention.
Figure 5:
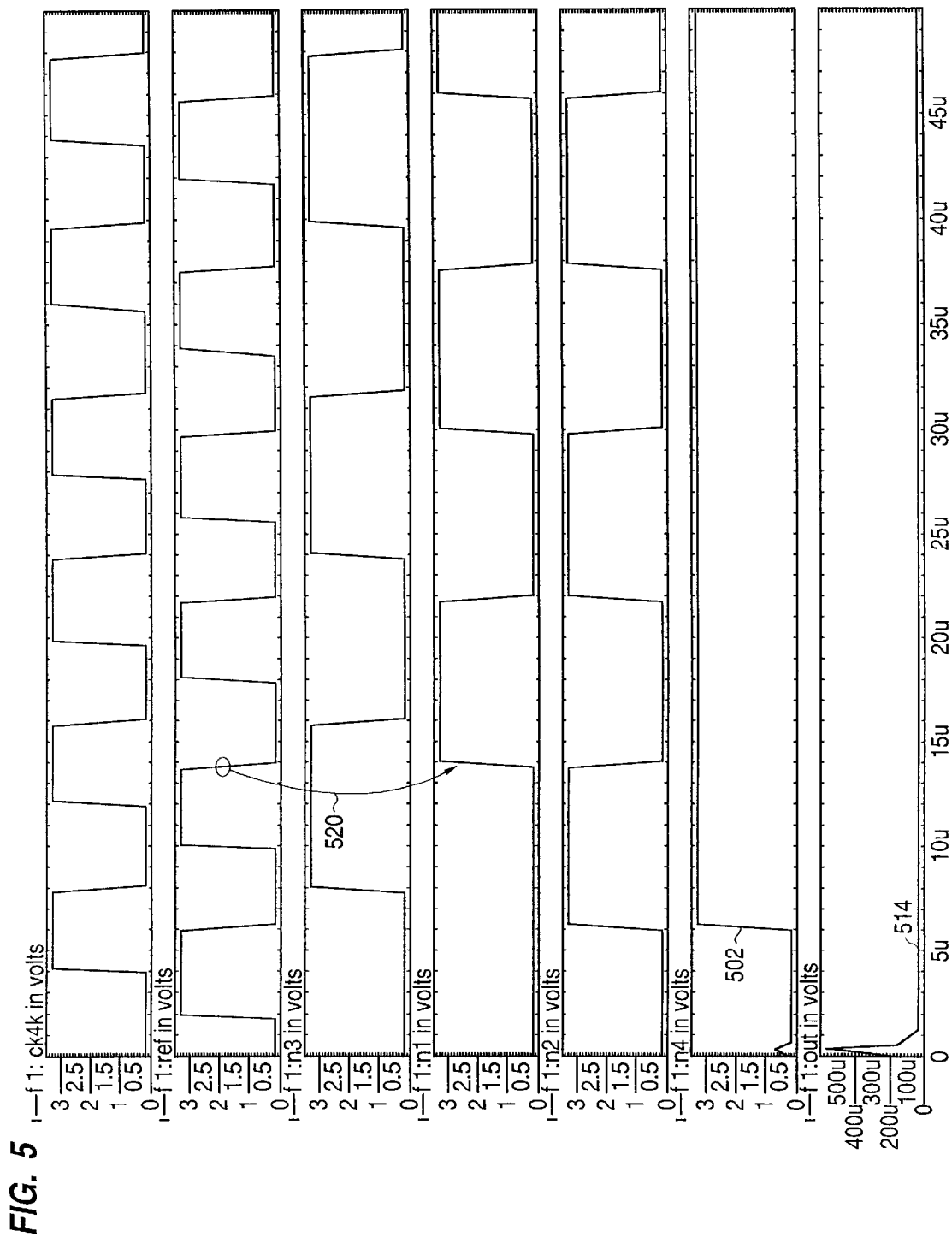
FIG. 5 illustrates a second waveform chart in accordance with the invention.

Referring now to FIG. 3, the electrical schematic for the BIST circuit 212 is shown in detail in accordance with the preferred embodiment. Both the oscillator's output signal 116 and the "ref" signal 210 are provided as inputs to the input ports of the BIST circuit 212. The BIST circuit 212 acts as a frequency comparison circuit which provides an output signal which indicates whether the two input frequency signals 116 and 210 have substantially the same frequency or not. Since the 4 Khz signal 116 and the "ref" signal 210 come from different stages, most likely the two signals will not be synchronized. A first "D" flip-flop 301 divides the 4 Khz oscillator signal by two and provides a 2 Khz signal 314 at node "n3". The 2 Khz signal 314 is then synchronized with the ref signal 210 through a second "D" flip-flop 304 which acts as a signal synchronization means. The ref signal 210 acts as the clock source to flip-flop 304 and triggers on the trailing edge as shown in FIG. 4 and 5 by lines 420 and 520, respectively.

A third "D" flip-flop 306 divides the frequency of the "ref" signal 210 by two in order to produce a second 2 Khz signal 318 at node "n2". An exclusive-or gate 308 is used to compare signals 316 and 318. If signals 316 and 318 have substantially the same frequency, node "n4" which is coupled to gate 308 via an inverter 310, will be a logic low all of the time as shown in FIG. 4 in waveform 402. Alternatively, node "n4" will go from a logic low to a logic high and remain their as shown in waveforms 502 and 602 shown in FIGS. 5 and 6, respectively.

A reset pin 302 provides for the ability to reset the BIST circuit 212. If the test circuit 200 is located within an IC as shown in FIG. 9, the reset pin 212 could also be a pin out of the IC. In the case where the test circuit 200 is part of a board level circuit, the reset pin 212 can be coupled to a controller (not shown) such as a microprocessor which can cause a reset condition to occur (e.g., prior to the frequency test being conducted). This is useful for situations in which test circuit 200 is implemented as part of a system design. In this case the system can be programmed to periodically test the oscillator circuit 100 in order to determine if it is still operational.

FIGS. 4–8 illustrate different examples of signal conditions which may be present in circuit 212. Each of the waveform charts shown in FIGS. 4–8 include signal conditions for: the oscillator's output signal 116; the reference frequency generating circuit's "ref" signal 210; the signal conditions found on circuit 212 on nodes "n3", "n1", "n2" and "n4"; and the signal condition for the BIST's output port 214 in that order.

In FIG. 4 for example, waveform 404 highlights the waveform for input signal 116, waveform 406 shows the waveform for the input ref signal 210, waveform 408 is the waveform for the signal at node n3, waveform 410 is the waveform for the signal present at node n1, waveform 412 is the signal waveform for the signal at node n2, and waveform 414 is the waveform for the signal at output 214, all for a particular set of signal conditions.

Since the signal at node n4 is low all the time, as shown by waveform 402, the test condition signal found on output 214 remains at a logic low as illustrated by waveform 414. A test condition signal having a logic low in this embodiment, indicates that the circuit is operational since the "ref" signal 210 and input signal 116 have substantially the same frequency.

Figure 6:
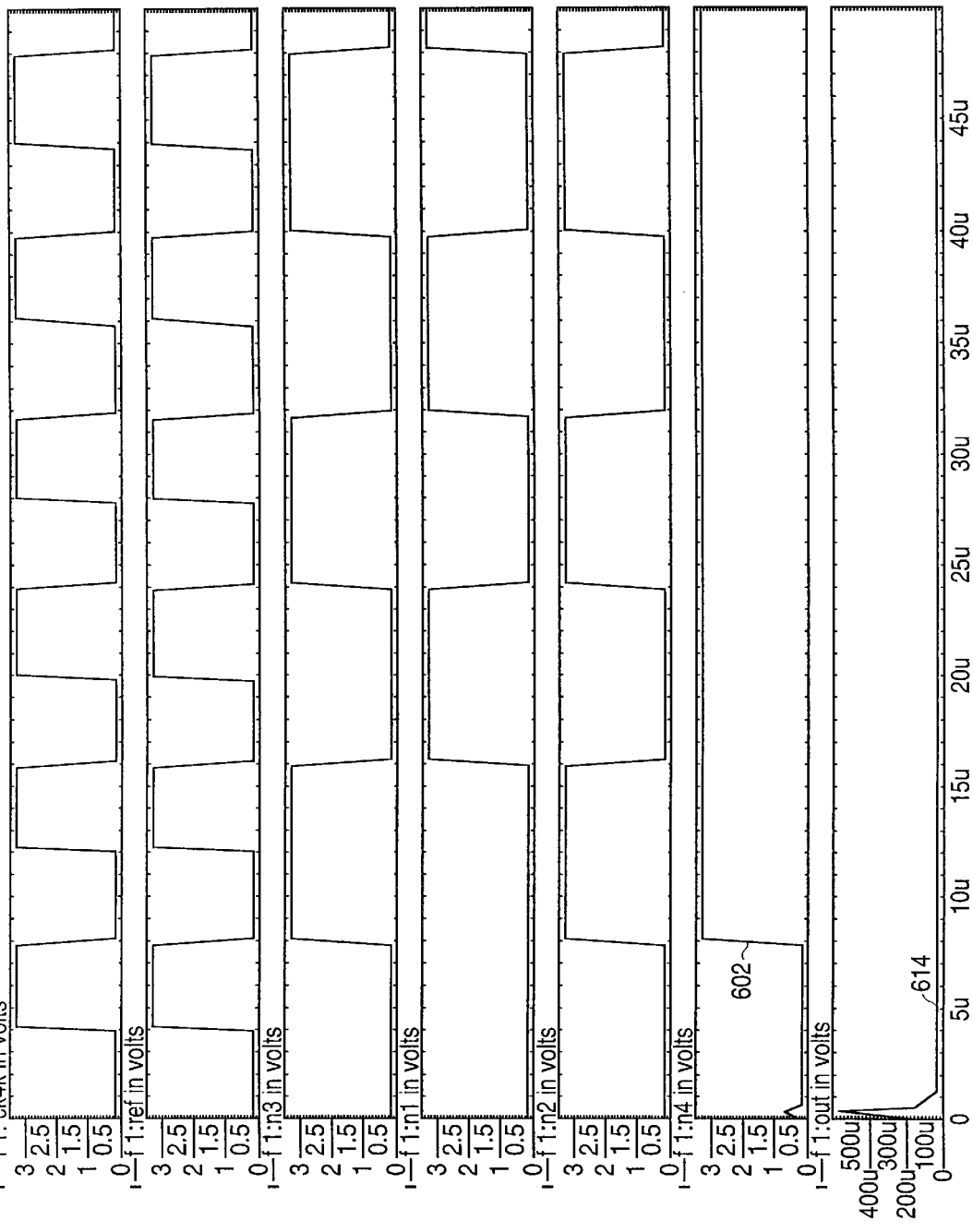
FIG. 6 illustrates a third waveform chart in accordance with the invention.

In FIGS. 5 and 6, it is shown that if the oscillator output signal 116 and the "ref" signal 210 have substantially the same frequency, the output port 214 of the BIST circuit 212 will be a logic low as shown by waveforms 514 and 614. In both FIGS. 5 and 6, the respective output test condition signals 514 and 614 remain a logic low because the signal at node "n4" in both examples goes from an initial low state to a high logic state and remains there as shown by waveforms 502 and 602. Since node "n4" is the clock signal input for flip-flop 312, the output port 214 is forced to remain at a logic low state.

Figure 7:
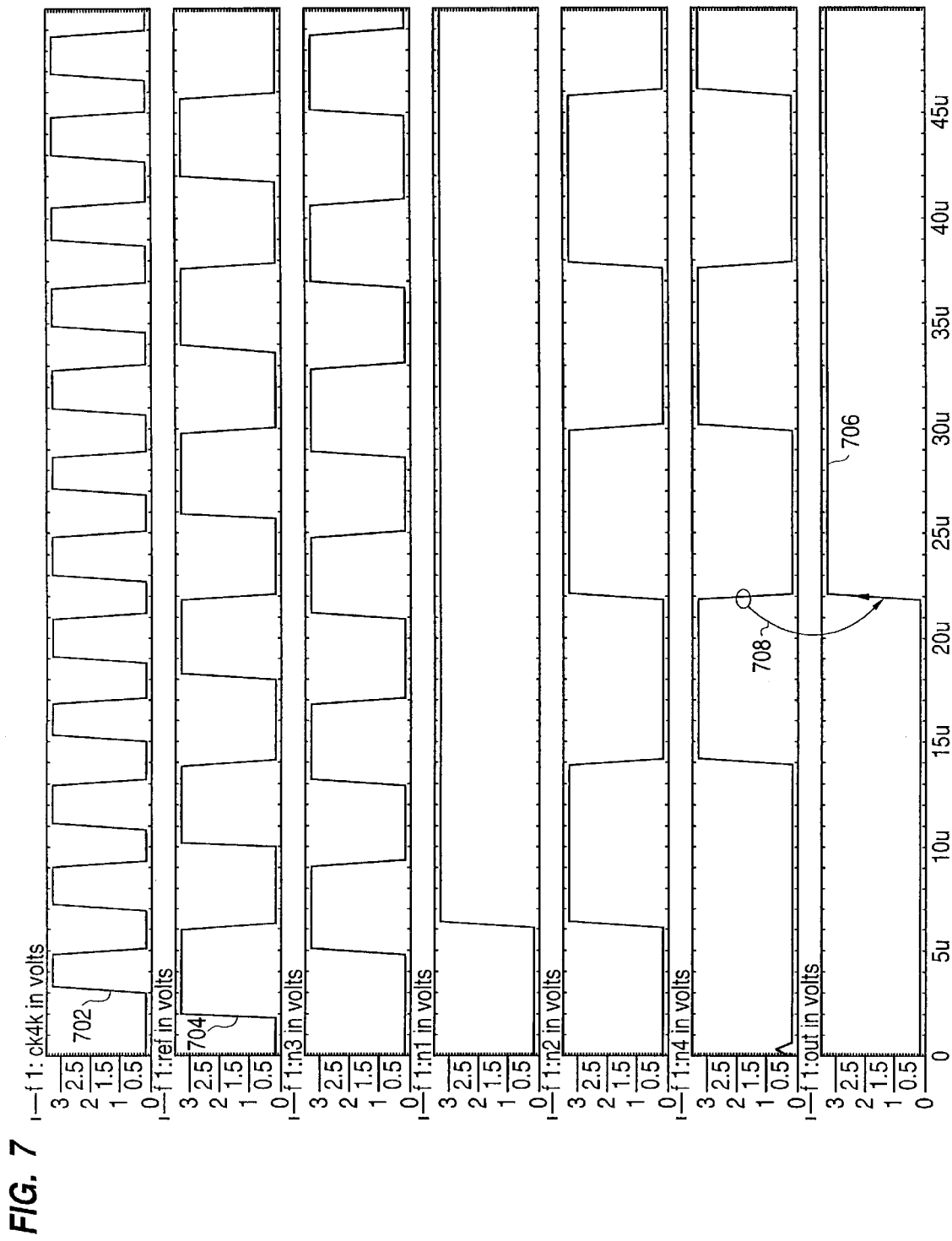
FIG. 7 illustrates a fourth waveform chart in accordance with the invention.
Figure 8:
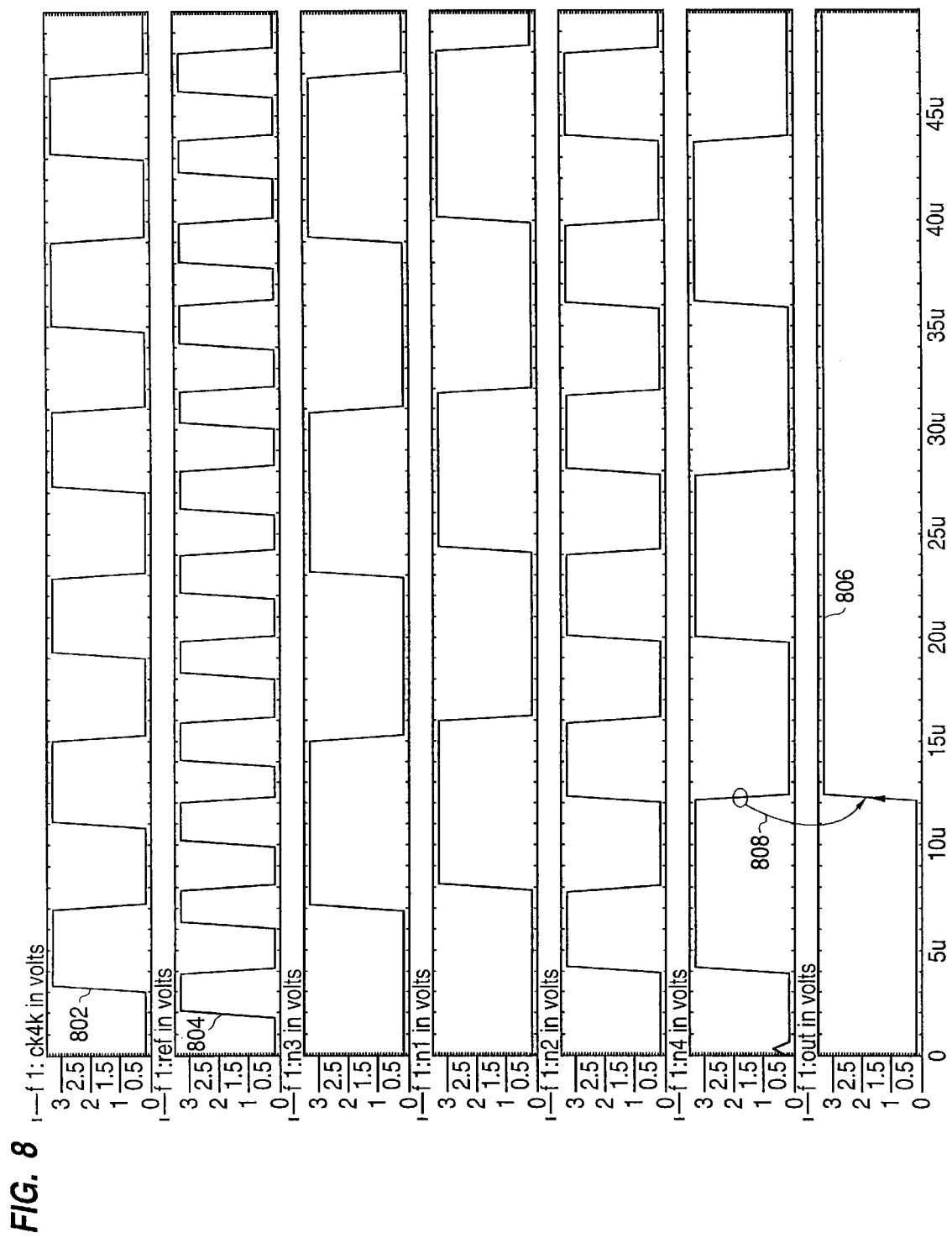
FIG. 8 illustrates a fifth waveform chart in accordance with the invention.

In the situation where the oscillator's output signal 116 and the "ref" signal 210 have different frequencies, as illustrated in the examples shown in FIGS. 7 and 8 by waveform sets 702, 704 and 802, 804 respectively, the test condition signals 706 and 806 on output port 214 will turn to a logic high and stay in that condition. The output signals 706 or 806 in these two examples go from a logic low to a logic high in response to a high to low logic level transition in node "n4" as shown by highlight lines 708 and 808.

While the present invention has been described in conjunction with specific embodiments, it is evident that many alternatives, modifications and variations will be apparent to those skilled in the art in light of the foregoing description. For example, the present invention can be used in both IC and circuit board level environments. The present invention can also test the frequency output signal for many different types of frequency generating circuits. The reference frequency circuit which was implemented in the preferred embodiment with components 202–208 can be designed in numerous ways in order to achieve a "ref" signal which is substantially equivalent to the frequency signal produced for the circuit that is to be tested (e.g., oscillator 100, etc.). At the same time, the design of the BIST 212 can be adjusted to accommodate different test requirements. Accordingly, it is intended that the present invention embrace all such alternatives, modifications and variations as fall within the broad scope of the appended claims.

What is claimed is:

1. A built-in frequency test circuit used for testing a frequency generating circuit which produces an output frequency signal when the frequency generating circuit is operational, said built-in frequency test circuit comprising:

a reference signal circuit which produces a reference signal having substantially the same frequency as the output frequency signal generated by the frequency generating circuit when it is operational; and a comparison circuit for comparing the frequency of the output frequency signal generated by the frequency generating circuit and the frequency of the reference signal, the comparison circuit providing a test condition signal which directly indicates whether or not the output frequency signal and the reference signal have substantially the same frequency.

2. A built-in frequency test circuit as defined in claim 1, wherein the built-in test circuit comprises the frequency generating circuit.

3. A built-in frequency test circuit as defined in claim 2, wherein the frequency generating circuit comprises a crystal oscillator.

4. A built-in frequency test circuit as defined in claim 1, wherein the comparison circuit further includes a synchronization circuit for synchronizing the reference signal to the output frequency signal generated by the frequency generating circuit.

5. The built-in frequency test circuit as defined in claim 4, wherein the comparison circuit logically compares the reference signal and the output frequency signal after they are synchronized by the synchronization circuit.

6. A built-in frequency test circuit as defined in claim 1, wherein the reference signal circuit is coupled to the frequency generating circuit.

7. A built-in frequency test circuit as defined in claim 6, wherein the frequency generating circuit comprises a multi-stage circuit and the reference signal circuit has the same number of stages as the frequency generating circuit.

8. The built-in frequency test circuit as defined in claim 1, wherein both the output frequency signal and the reference signal are generated from a common crystal oscillator.

9. An integrated circuit comprising:

a frequency generating circuit which produces an output frequency signal of a given frequency when the frequency generating circuit is operational;

a reference frequency circuit coupled to the frequency generating circuit, the reference frequency circuit produces a reference signal having substantially the same frequency as the output frequency signal generated by the frequency generating circuit when it is operational; and a comparison circuit for comparing the frequency of the output frequency signal generated by the frequency generating circuit and the frequency of the reference signal, the comparison circuit providing a test condition signal which directly indicates whether or not the output frequency signal and the reference signal have substantially the same frequency.

10. An integrated circuit as defined in claim 9, wherein the test condition signal is provided to an external test output pin which is electrically coupled to the comparison circuit.

11. An integrated circuit as defined in claim 9, wherein the comparison circuit includes a synchronization circuit for synchronizing the output frequency signal and the reference signal prior to the frequency of the output frequency signal and the frequency of the reference signals are compared.

12. An integrated circuit as defined in claim 11, wherein the synchronization circuit comprises a D flip-flop having a clock input coupled to the reference signal and a data input port coupled to the output frequency signal generated by the frequency generating circuit.

13. An integrated circuit as defined in claim 11, wherein the reference frequency circuit and the comparison circuit alternate between an operational mode in which the frequency generating circuit is being tested and a non-operational mode in which the frequency generating circuit is not being tested.

14. An integrated circuit as defined in claim 9, further comprising an external test mode pin coupled to the reference frequency circuit and the comparison circuit, the voltage level on the test mode pin controls whether the reference frequency circuit and the comparison circuit are operational or not.

15. An integrated circuit as defined in claim 9, wherein the frequency generating circuit comprises an oscillator circuit.

16. An integrated circuit as defined in claim 15, wherein the oscillator circuit is a multi-stage oscillator circuit and the reference frequency circuit is a multi-stage circuit having the same number of stages as the multi-stage oscillator circuit.

17. The integrated circuit as defined in claim 9, wherein both the output frequency signal and the reference signal are generated from a common crystal oscillator.

18. An integrated circuit comprising:

a frequency generating circuit which produces an output frequency signal of a given frequency when the frequency generating circuit is operational;

a reference frequency circuit coupled to the frequency generating circuit, the reference frequency circuit produces a reference signal having substantially the same frequency as the output frequency signal generated by the frequency generating circuit when it is operational; and a comparison circuit for comparing the frequency of the output frequency signal generated by the frequency generating circuit and the frequency of the reference signal and providing a test condition signal which indicates the operational condition of the frequency generating circuit, wherein both the output frequency signal and the reference signal are generated from a common oscillator.

19. The integrated circuit as defined in claim 18, wherein the comparison circuit includes:

a synchronization circuit for synchronizing the reference signal and the output frequency signal; and at least one logic gate for logically comparing the reference signal and the output frequency signal after they are synchronized by the synchronization circuit.

20. The integrated circuit as defined in claim 18, wherein the common oscillator is a crystal oscillator.

* * * * *